(12) United States Patent
Jur et al.

(10) Patent No.: US 9,425,603 B2
(45) Date of Patent: Aug. 23, 2016

(54) BUS PLUG APPARATUS USING MULTIPLE INTERCONNECTED ENCLOSURES

(71) Applicant: Eaton Corporation, Cleveland, OH (US)

(72) Inventors: Arthur James Jur, Greenwood, SC (US); Douglas Von Taylor, Greenwood, SC (US); John Michael Kokenda, Greenwood, SC (US); David Ladd Kelley, Greenwood, SC (US)

(73) Assignee: Easton Corporation, Cleveland, OH (US)

( * ) Notice: Subject to any disclaimer, the term of this patent is extended or adjusted under 35 U.S.C. 154(b) by 284 days.

(21) Appl. No.: 14/019,654

(22) Filed: Sep. 6, 2013

(65) Prior Publication Data

US 2015/0070820 A1 Mar. 12, 2015

(51) Int. Cl.
  *H05K 5/00* (2006.01)
  *H02G 5/08* (2006.01)
  *H05K 5/02* (2006.01)

(52) U.S. Cl.
  CPC .............. *H02G 5/08* (2013.01); *H05K 5/0247* (2013.01)

(58) Field of Classification Search
  CPC .............................. H02G 5/08; H05K 5/0247
  USPC ............ 361/611, 624, 637, 648, 675, 679.01, 361/748, 760, 772, 775
  See application file for complete search history.

(56) References Cited

U.S. PATENT DOCUMENTS

| | | | | |
|---|---|---|---|---|
| 2,261,857 | A * | 11/1941 | Novak et al. ................. | 174/72 B |
| 7,091,417 | B1 * | 8/2006 | Jur et al. ...................... | 174/68.2 |
| 7,969,750 | B2 * | 6/2011 | Jur et al. ...................... | 361/825 |
| 8,325,467 | B2 * | 12/2012 | Shea et al. .................... | 361/601 |

FOREIGN PATENT DOCUMENTS

| | | |
|---|---|---|
| DE | 195 40 334 A1 | 4/1997 |
| DE | 199 17 352 A1 | 10/2000 |

OTHER PUBLICATIONS

International Search Report and Written Opinion Corresponding to International Application No. PCT/US2014/052267; Date of Mailing: Nov. 10, 2014; 7 Pages.
International Preliminary Report on Patentability and Written Opinion; Corresponding to International Application No. PCT/US2014/052267; Date of Mailing: Mar. 17, 2016; 5 Pages.

* cited by examiner

*Primary Examiner* — Bernard Rojas
(74) *Attorney, Agent, or Firm* — Myers Bigel & Sibley, P.A.

(57) ABSTRACT

An apparatus includes a first enclosure configured to be mounted on a first wall of a bus duct and housing at least one circuit protective device and a connector assembly configured to engage an outlet of the bus duct of the first wall of the bus duct. The apparatus further includes a second unit including a second enclosure mounted on the first enclosure and housing at least one metering device and wiring passing between the first and second enclosures.

17 Claims, 5 Drawing Sheets

BUS PLUG APPARATUS USING MULTIPLE INTERCONNECTED ENCLOSURES

FIELD

The inventive subject matter relates generally to bus duct systems and, more particularly, to plug in apparatus for bus ducts.

BACKGROUND

Bus ducts (or "busway") are typically used to provide low-voltage, high-current power distribution in commercial and industrial electric power distribution applications such as industrial plants and data centers. A typical bus duct includes an elongate housing with a substantially rectangular cross section containing a plurality of conductive bus bars therein. Outlets are typically located at intervals along the bus duct to provide means for connecting loads and other devices.

A typical bus duct application may require various power distribution and monitoring capabilities. For example, in a data center application, equipment racks typically receive power from bus ducts and voltages and currents provided to such loads are often monitored by a central control system.

Loads are commonly connected to the bus duct using bus plug units that are designed to be plugged into the bus duct outlets. For example, a power distribution bus plug unit may support provision of multiple branch circuits via circuit breakers housed in the bus plug unit enclosure. Metering and other monitoring devices may also be provided in plug-in units. Such devices may include communications circuitry and may be used, for example, to provide voltage and/or current information to an external control system.

Applications often require various different combinations of such power distribution and control components. However, because each installation tends to be unique in its requirements, bus plug units are often custom made for the application. For example, a typical data center application may require power distribution for multiple branch circuits and current metering for those branch circuits. Commonly, this need is met by custom plug-in units having an enclosure housing a plurality of circuit breakers, current transformers for sensing current passing through the circuit breakers, current metering circuitry coupled to the current transformers and communications circuitry for communicating information to external control systems.

SUMMARY

Some embodiments of the inventive subject matter provide an apparatus including a first enclosure configured to be mounted on a first wall of a bus duct and housing at least one circuit protective device and a connector assembly configured to engage an outlet of the bus duct of the first wall of the bus duct. The apparatus further includes a second unit including a second enclosure mounted on the first enclosure and housing at least one metering device and wiring passing between the first and second enclosures.

The second enclosure may include a first wall facing a second wall of the first enclosure, wherein the second wall of the first enclosure is oriented perpendicular to the first wall of the first enclosure. The second enclosure may extend perpendicular to the first wall of the bus duct to overlie a second wall of the bus duct. The wiring may pass between the first wall of the second enclosure and a second wall of the first enclosure. A load wiring passage may be located in a third wall of the first enclosure.

The first enclosure may further house a current transformer. The second enclosure may further house a circuit protection device, a display and/or communications circuitry. The first enclosure may be configured to interchangeably house a selection of different circuit protection devices and the second enclosure may be configured to interchangeably house a selection of different metering devices.

Further embodiments of the inventive subject matter provide an apparatus including an enclosure configured to house at least one circuit protection device and having a first wall configured to be mounted on a side wall of a bus duct and a connector supported by the enclosure and configured to be electrically coupled to the circuit protection device and to engage an outlet on the wall of the bus duct to provide electrical connection of the circuit protection device to one or more conductors of the bus duct. The apparatus further includes means for supporting wiring to another enclosure attached to a second wall of the enclosure.

The second wall may be configured to be mated to a wall of another enclosure mounted on a top or bottom wall of the bus duct. The apparatus may further include line connection terminals, load connection terminals and/or a current transformer mounted in the enclosure. The apparatus may further include an opening through a third wall of the enclosure configured to provide a load wiring passage. The third wall may be opposite the second wall. The apparatus may include a terminal block within the enclosure and configured to support interconnection of components.

Additional embodiments provide an apparatus including an enclosure configured to house at least one metering device and having a first wall configured to be face a top wall or bottom wall of a bus duct when the enclosure is attached to another enclosure on a side wall of the bus duct and means for supporting wiring to the other enclosure. The enclosure may be further configured to house a circuit protection device, a display and/or a communications device.

The enclosure may include a second wall configured to support the display and/or the circuit protection device. A terminal block may be disposed within the enclosure and configured to support interconnection of components.

DETAILED DESCRIPTION

Figure 1:
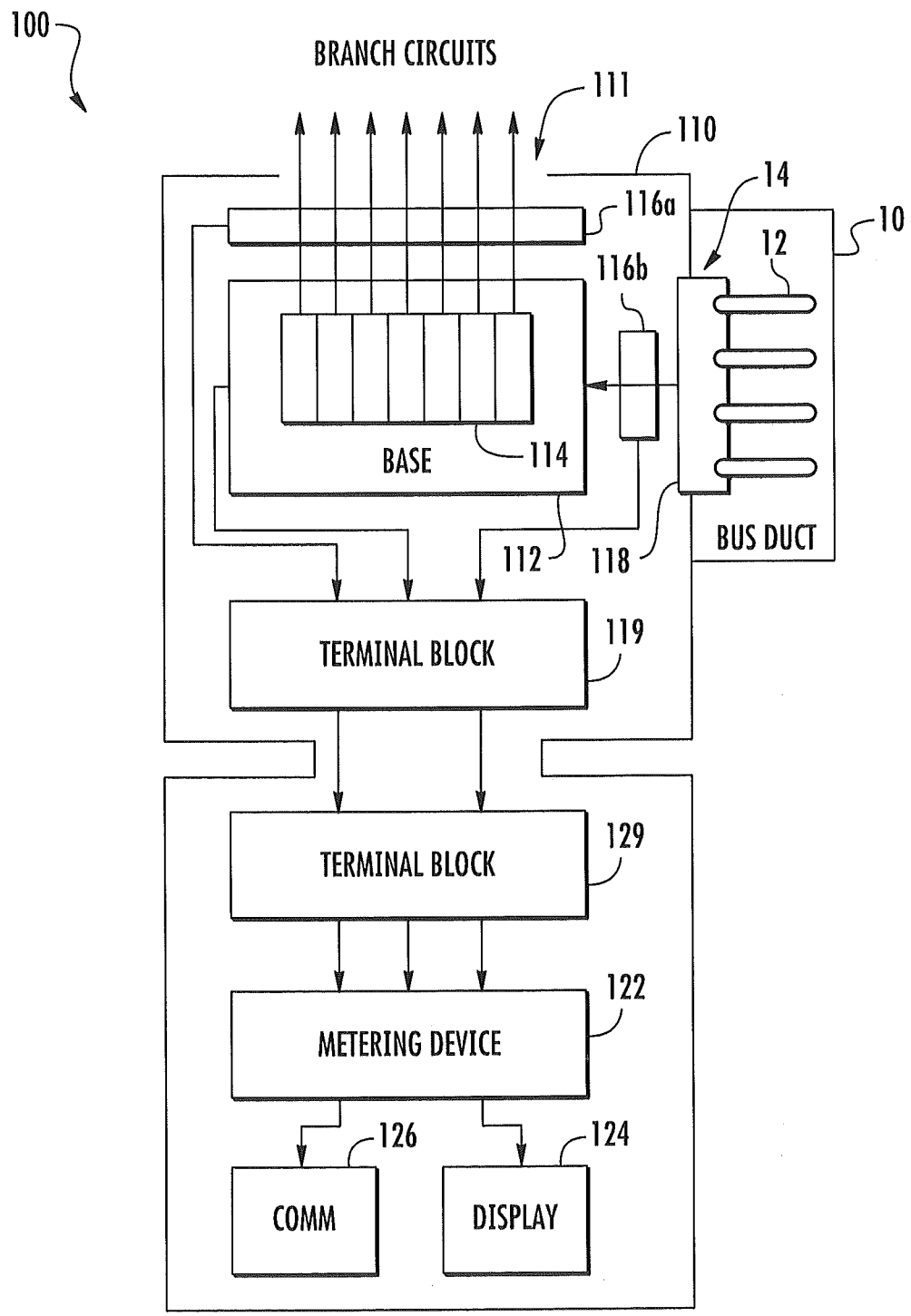
FIG. 1 is a schematic diagram illustrating a bus plug assembly according to some embodiments of the inventive subject matter.
Figure 2:
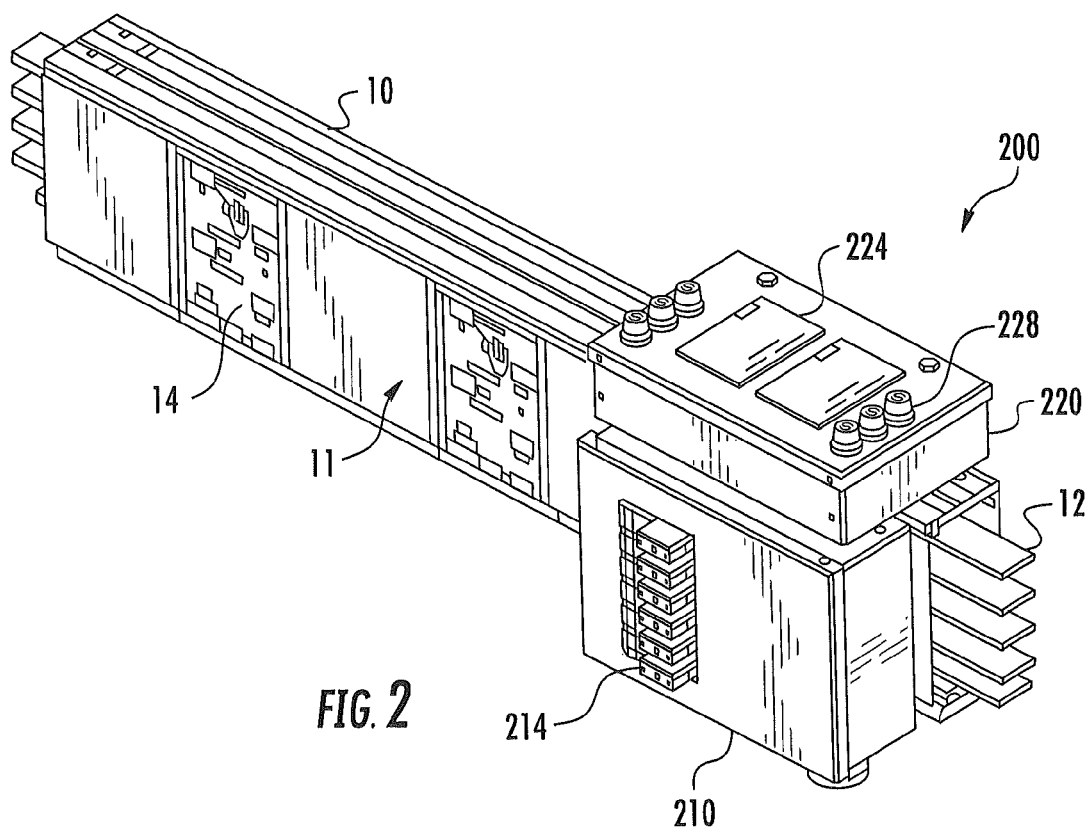
FIG. 2 is a perspective view of a bus plug assembly mounted on a bus duct according to some embodiments of the inventive subject matter.
Figure 3:
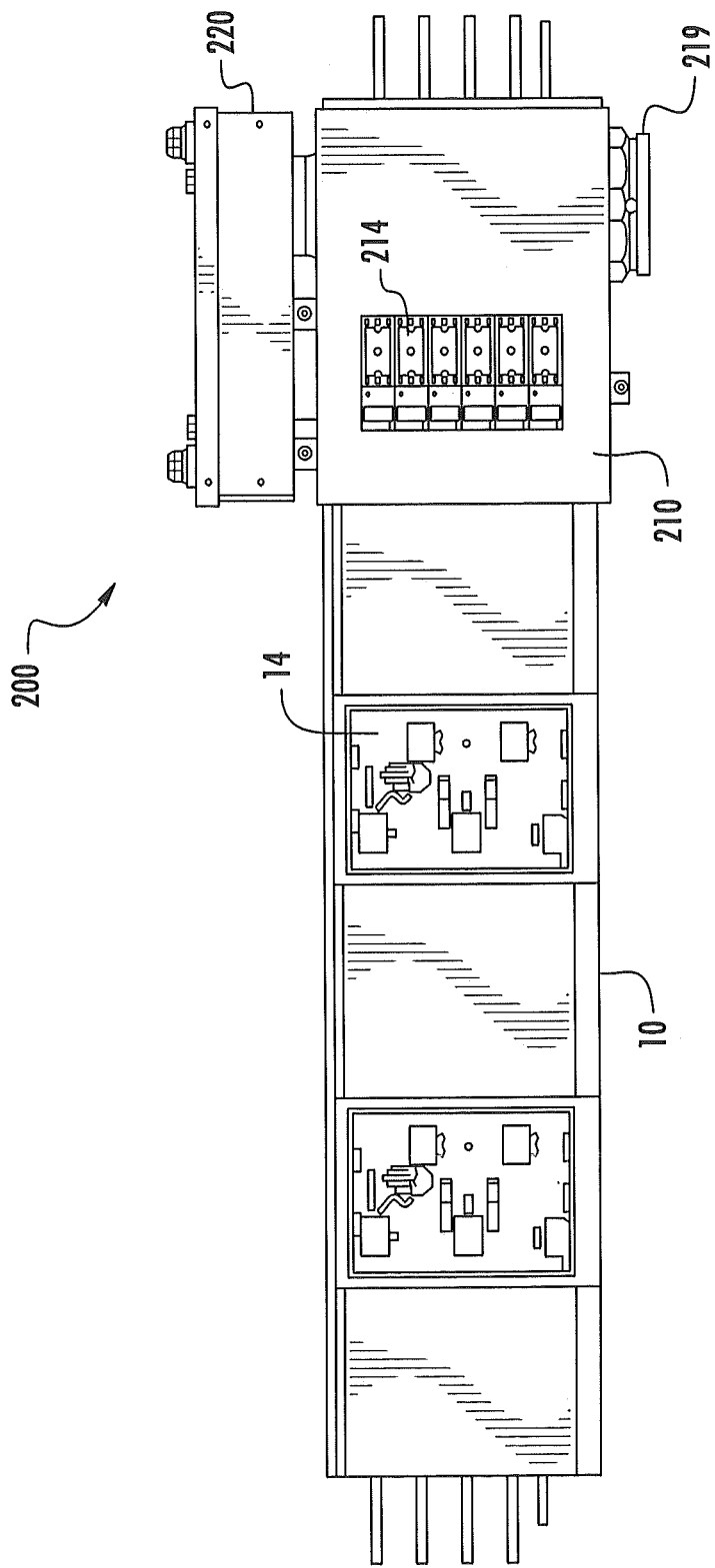
FIG. 3 is a first side elevation of the bus plug assembly of FIG. 2.
Figure 4:
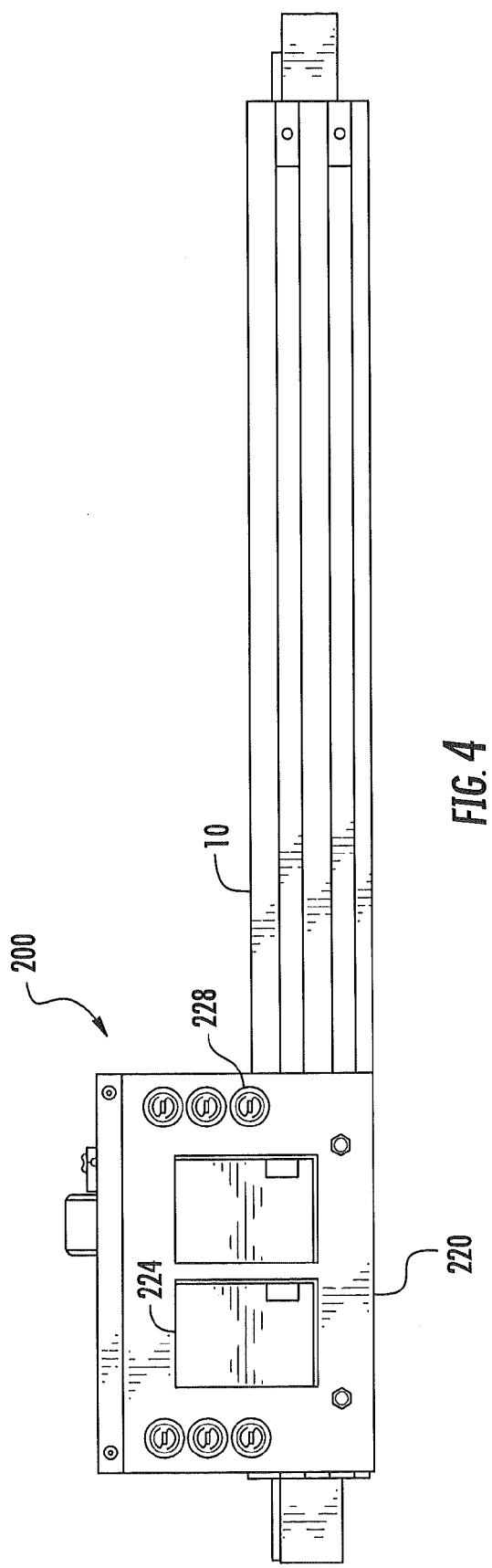
FIG. 4 is a top elevation of the bus plug assembly of FIG. 2.

The inventive subject matter now will be described more fully hereinafter with reference to the accompanying drawings, in which illustrative embodiments of the inventive subject matter are shown. In the drawings, the relative sizes of regions or features may be exaggerated for clarity. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout. As used herein the term "and/or" includes any and all combinations of one or more of the associated listed items.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein the expression "and/or" includes any and all combinations of one or more of the associated listed items.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Some embodiments of the inventive subject matter arise from a realization that bus duct applications often require various different combinations of power distribution and control components. Commonly, this need is met by using plug-in units with customized enclosures. However, this may not take advantages of commonalities among applications and lead to undue cost and delays in production. Some embodiments may address these issues by providing a modular bus plug assembly including multiple interconnected enclosures that interface to a bus duct using one bus duct outlet and which are configured to house various circuit protection and monitoring devices.

According to some embodiments, for example, a two-piece bus plug unit may include a first enclosure that is configured to plug into a bus duct outlet and to house one or more circuit protection devices for circuits branching from the enclosure, and a second enclosure attached to the first enclosure and configured to house at least one metering device, such as a current meter, which a wiring passage being provided between the first and second enclosures. The parts within each of the enclosures, such as the types of circuit protection devices and types of metering devices, may be varied depending upon customer requirements. Sensors and/or other circuitry may also be housed in the enclosures. For example, in some embodiments, the first enclosure may house current transformers for sensing currents passing to and/or from the circuit protection devices, while the second enclosure may house a current metering device coupled to the current transformers, a display and/or communications circuitry for communicating information to an external control system. Interconnecting wiring between the components in the first and second enclosures may pass through the wiring passage running between opposing walls of the enclosures.

FIG. 1 schematically illustrates a bus plug assembly 100 according to some embodiments of the inventive subject matter. The assembly 100 includes a first enclosure 110 configured to be attached to a bus duct 10. A connector 118 is supported by the first enclosure 110 and is configured to engage bus bars 12 of the bus duct 10 via a bus duct outlet 14. The connector 118 is electrically coupled to a circuit protection device base 112, e.g., an assembly of conductors and supporting structures configured for installation of at least one circuit protection device, e.g., circuit breakers 114 which provide protection for respective branch circuits passing out of the first enclosure 110 via an external load wiring passage 111. The first enclosure 110 may further house one or more sensors, such as current transformers (CTs) 116a that sensor currents in the branch circuits and/or CTs 116b that sense the input current to the circuit protection device base 112.

The assembly 100 further includes a second enclosure 120 configured to be mechanically attached to the first enclosure 110. The second enclosure 120 may be configured to house at least one monitoring device, such as a metering device 122. The second enclosure 120 may also house other devices, such as one or more displays 124 configured to display metering information generated by the metering device 122 and/or a communications circuit 126 configured to communicate metering and/or control information between the metering device 122 and an external system.

The metering device 122 is coupled to the CTs 116a, 116b in the first enclosure 110 via wiring between the first enclosure 110 and the second enclosure 120. The wiring may be direct and/or may utilize intermediate connectors. As shown, respective terminal blocks 119, 129 may be located in the first and second enclosures 110, 120 to support the wiring between the first and second enclosures 110, 210. It will be appreciated that other interconnection mechanisms may be used.

FIGS. 2-5 illustrate an example of a bus plug assembly 200 according to some embodiments. The bus plug assembly 200 includes first rectangular box-like enclosure 110 configured to be mounted on a bus duct 10 so that a rear wall 215 of the first enclosure 110 faces a side wall 11 of the bus duct 10. As shown in the cross-sectional view of FIG. 5, the first enclosure 210 supports a connector having stab contacts 218 configured to pass through openings in a bus duct outlet 14 on the side wall 11 of the bus duct 10 to engage bus bars 12 within the bus duct 10. The contacts 218 are electrically coupled to a circuit breaker base within the first enclosure 110 in which circuit breakers 214 are mounted. It will be appreciated that circuit breakers 214 are shown for purposes of illustrations, and that other types of circuit protection devices may be used in some embodiments. Egress for branch circuit wiring coupled to the breakers 214 may be provided via an external wiring passage, such as knockout at which a conduit nipple 219 may be attached. Along lines explained above, the first enclosure 210 may further include sensors, such as CTs that sense current passing from the bus bars 12 to the circuit breakers 214 and/or CTs that sense currents in the respective branch circuits protected by the breakers 214.

The bus plug assembly 200 further includes a second enclosure 220 configured to mate with the first enclosure 210. In the illustrated embodiments, the second enclosure 220 is a second rectangular box configured to be attached to the first enclosure 210 and/or the bus duct 10 such that a back wall 223 of the second enclosure 220 is oriented perpendicularly to the back wall 215 of the first enclosure 210 and faces a sidewall 213 of the first enclosure 210. The second enclosure 220 extends therefrom to overlie a top wall 13 the bus duct 10. Along lines discussed above, the second enclosure 220 may house a metering device and, as shown, a corresponding display 224. As further shown, the second enclosure 220 may also house fuses 228 or other protective devices for the circuitry therein.

Figure 5:
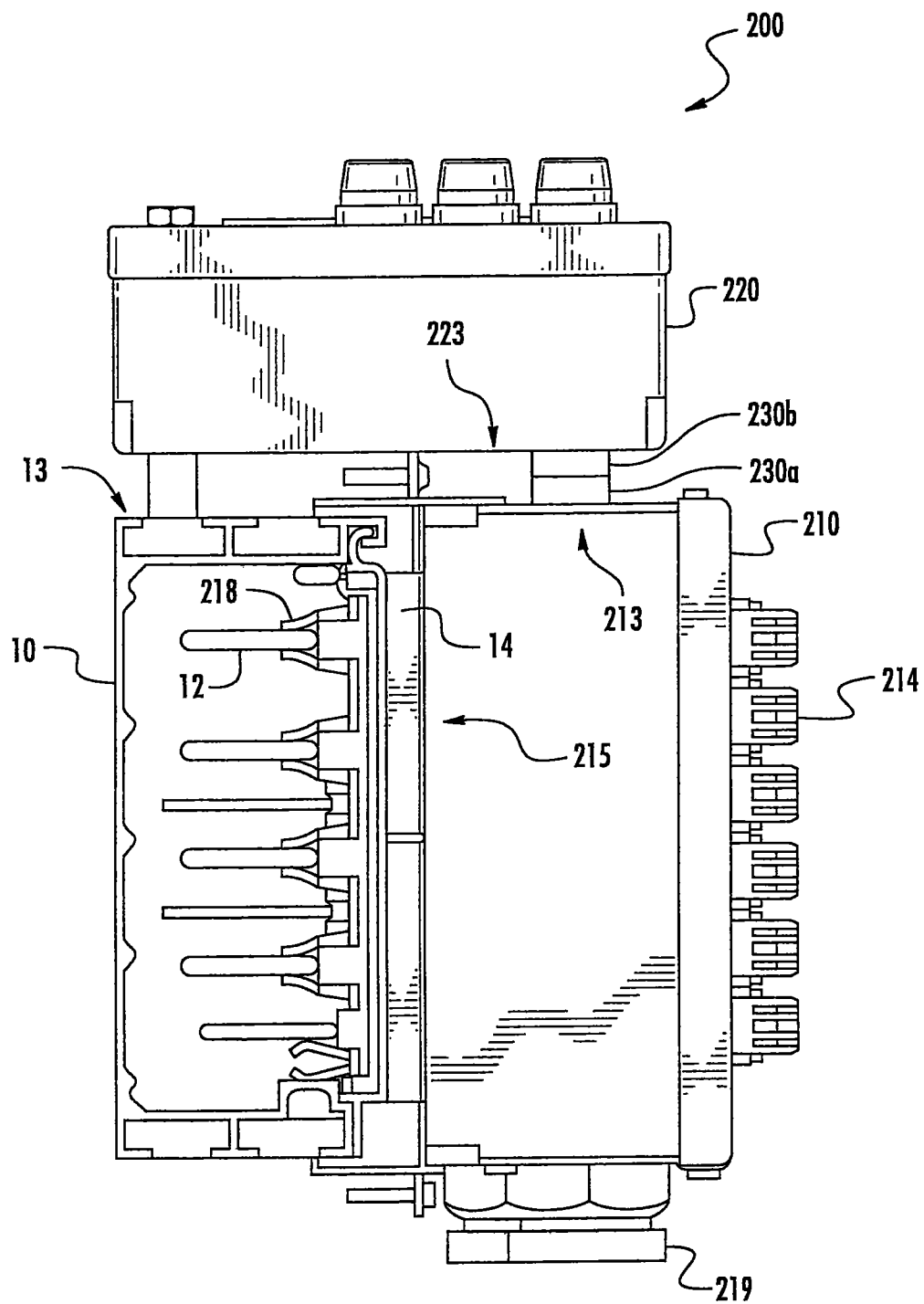
FIG. 5 is a second side elevation of the bus plug assembly of FIG. 2 with a cross-sectional view of an attached bus duct.

Components housed in the first enclosure 210 and the second enclosure 220 may be interconnected in a number of different ways. For example, as shown in FIG. 5, mating connectors 230a, 230b may be mounted at respective ones of the walls 213, 223 of the first and second enclosures 210, 220. The connectors 230a, 230b may be wired to components within the respective enclosures 210, 220. The connectors 230a, 230b may facilitate alignment of the enclosures 210, 220 before mounting on the enclosures on the bus duct 10 using brackets and/or other features. In some embodiments, rather than using connectors, a wiring passage may be provided between the back wall 223 of the second enclosure 220 and the sidewall 213 of the first enclosure using, for example, a conduit nipple coupling knockouts in the enclosure walls 213, 223. The wiring between the first and second enclosures 210, 220 may be implemented, for example, using respective terminal blocks contained within the first and second enclosures 210, 220.

It will be understood that the various components housed in the first enclosure 210 and the second enclosure 220 may be mechanically discrete or may be partially or fully integrated. For example, current sensors may be integrated with the breakers 224 and/or in a base in which the breakers 224 may be installed, and the display 224 may be part of an integrated structure including metering circuitry and other components, such as communications circuitry for wireline and/or wireless communication of control and monitoring information. In some embodiments, the various components used in the first enclosure 210 and the second enclosure 220 may be selected from a variety of different components depending on the application in which the assembly 200 is being used. The components may include breakers, such as Eaton FD, GD, and CH type breakers, metering devices, such as the Eaton IQ 35M, Eaton IQ 130/140/150 and WattNode® meters, and current sensors, such as the Eaton IQ35M-SO-050-50, Instrument Transformers Inc. 5SFT-600 and Acme Electric AC-1060. Other devices, such as solid state relays and fuse holders may also be used.

In the drawings and specification, there have been disclosed exemplary embodiments of the inventive subject matter. However, many variations and modifications can be made to these embodiments without substantially departing from the principles of the present inventive subject matter. Accordingly, although specific terms are used, they are used in a generic and descriptive sense only and not for purposes of limitation, the scope of the inventive subject matter being defined by the following claims.

That which is claimed:

1. An apparatus comprising:
   a first enclosure configured to be mounted on a first wall of a bus duct and housing at least one circuit protective device and a connector assembly configured to pluggably engage an outlet on the first wall of the bus duct;
   a second enclosure mounted on the first enclosure and housing at least one metering device; and
   wiring passing between the first and second enclosures.

2. The apparatus of claim 1, wherein the second enclosure comprises a first wall facing a second wall of the first enclosure, wherein the second wall of the first enclosure is oriented perpendicular to the first wall of the first enclosure.

3. The apparatus of claim 2, wherein the second enclosure extends perpendicular to the first wall of the bus duct to overlie a second wall of the bus duct.

4. The apparatus of claim 2, wherein the wiring passes between the first wall of the second enclosure and a second wall of the first enclosure.

5. The apparatus of claim 4, wherein a load wiring passage is located in a third wall of the first enclosure.

6. The apparatus of claim 1, wherein the first enclosure further houses a current transformer.

7. The apparatus of claim 1, wherein the second enclosure further houses a circuit protection device, a display and/or communications circuitry.

8. The apparatus of claim 1, wherein the first enclosure is configured to interchangeably house a selection of different circuit protection devices and wherein the second enclosure is configured to interchangeably house a selection of different metering devices.

9. An apparatus comprising:
   a first enclosure configured to house at least one circuit protection device and having a first wall configured to be mounted on a side wall of a bus duct;
   a connector supported by the first enclosure and configured to be electrically coupled to the circuit protection device and to pluggably engage an outlet on the side wall of the bus duct to provide electrical connection of the circuit protection device to one or more conductors of the bus duct; and
   means for supporting wiring to a second enclosure attached to a second wall of the first enclosure, wherein the second enclosure is mounted on a top or bottom wall of the bus duct.

10. The apparatus of claim 9, further comprising line connection terminals, load connection terminals and/or a current transformer mounted in the first enclosure.

11. The apparatus of claim 9, further comprising an opening through a third wall of the first enclosure configured to provide a load wiring passage.

12. The apparatus of claim 11, wherein the third wall is opposite the second wall.

13. The apparatus of claim 9, further comprising a terminal block within the first enclosure and configured to support interconnection of components.

14. An apparatus comprising:
   a first enclosure configured to house at least one metering device and having a first wall configured to face a top wall or bottom wall of a bus duct when the first enclosure is attached to a second enclosure having a connector plugged into an outlet on a side wall of the bus duct; and
   means for supporting wiring to the second enclosure.

15. The apparatus of claim 14, wherein the first enclosure is further configured to house a circuit protection device, a display and/or a communications device.

16. The apparatus of claim 15, wherein the first enclosure comprises a second wall configured to support the display and/or the circuit protection device.

17. The apparatus of claim 14, further comprising a terminal block within the first enclosure and configured to support interconnection of components.

* * * * *